US012683552B2

(12) United States Patent
Huusari et al.

(10) Patent No.: US 12,683,552 B2
(45) Date of Patent: Jul. 14, 2026

(54) MODE SELECT FOR MULTI-FREQUENCY OSCILLATORS

(71) Applicant: Intel Corporation, Santa Clara, CA (US)

(72) Inventors: Timo Huusari, Hillsboro, OR (US); Mohamed A Abdelmoneum, Portland, OR (US); Brent R. Carlton, Portland, OR (US); Somnath Kundu, Hillsboro, OR (US); Hao Luo, Milpitas, CA (US); Sarah Shahraini, Santa Clara, CA (US); Jason Mix, Portland, OR (US); Eduardo Alban, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 17/854,534

(22) Filed: Jun. 30, 2022

(65) Prior Publication Data

US 2024/0007050 A1    Jan. 4, 2024

(51) Int. Cl.
*H03B 5/36*        (2006.01)
*H03B 5/06*        (2006.01)
(52) U.S. Cl.
CPC .............. *H03B 5/36* (2013.01); *H03B 5/06* (2013.01); *H03B 5/364* (2013.01); *H03B 2200/0094* (2013.01)
(58) Field of Classification Search
CPC .... H03B 5/36; H03B 5/06; H03B 2200/0094; H03B 5/364; H03B 5/366; H03B 5/362
USPC .......................... 331/22, 2, 158, 183, 116 FE
See application file for complete search history.

(56) References Cited

U.S. PATENT DOCUMENTS

| | | | |
|---|---|---|---|
| 11,205,995 B2 | 12/2021 | Carlton et al. | |
| 2008/0074206 A1* | 3/2008 | Matsumoto | H03B 5/36 |
| | | | 331/158 |
| 2014/0009234 A1* | 1/2014 | Aichner | H03B 5/36 |
| | | | 331/49 |

FOREIGN PATENT DOCUMENTS

WO      WO-2010084838 A1 *   7/2010   .............. H03B 5/36

OTHER PUBLICATIONS

Razavi, Behzad, "Jitter-Power Trade-Offs in PLLs", IEEE Transactions on Circuits and Systems—I: Regular Papers, vol. 68, No. 4, Apr. 2021, pp. 1381-1387.
Texas Instruments, "LMK5B12204 Ultra-Low Jitter Network Synchronizer Clock With Two Frequency Domains", SNAS810A, May 2020, Revised Jan. 2021, 94 pages.

* cited by examiner

*Primary Examiner* — Arnold M Kinkead
(74) *Attorney, Agent, or Firm* — NICHOLSON DE VOS WEBSTER & ELLIOTT LLP

(57)        ABSTRACT

An apparatus, system, and method for multi-frequency oscillator control are provided. A circuit can include a resonator circuit including an input and an output, the resonator circuit configured to resonate at a fundamental frequency and a different, non-fundamental frequency, a startup circuit electrically coupled to the input, the startup circuit configured to generate a signal at about the non-fundamental frequency and detect when the resonator circuit is resonating at the non-fundamental frequency, and an oscillator driver circuit electrically coupled to the output, the oscillator driver circuit configured to amplify and buffer the output of resonator circuit and drive a load.

17 Claims, 6 Drawing Sheets

600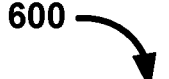

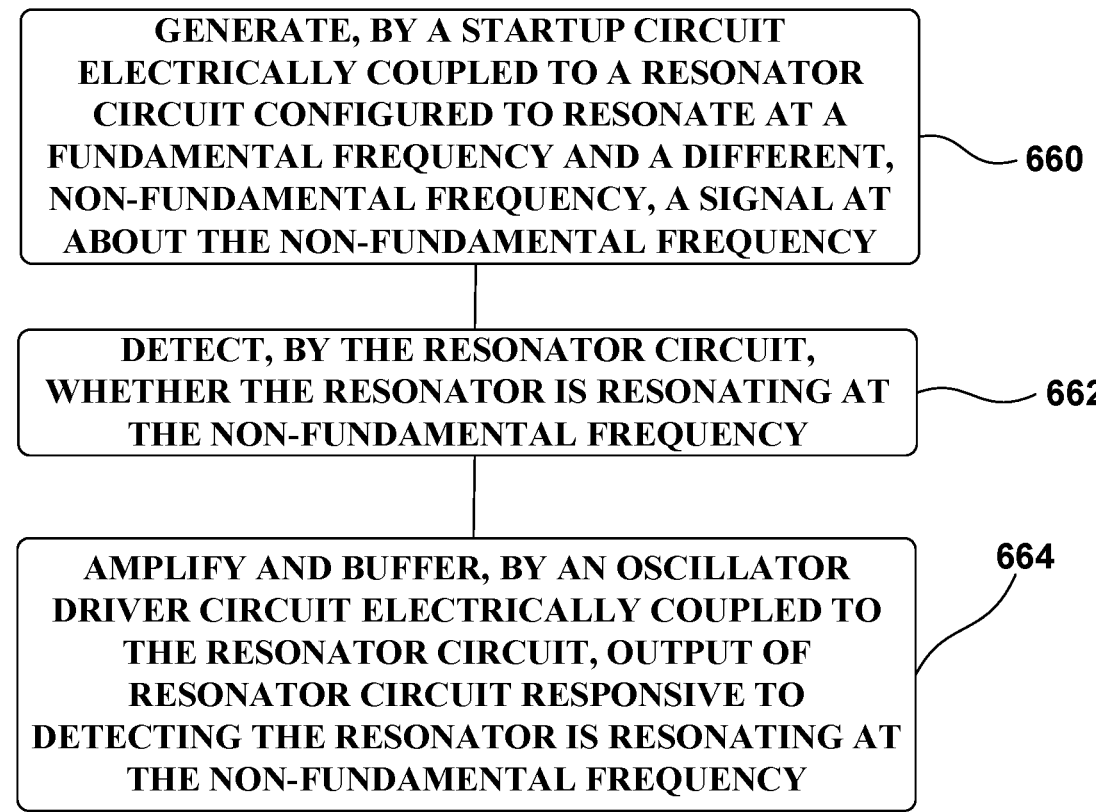

GENERATE, BY A STARTUP CIRCUIT ELECTRICALLY COUPLED TO A RESONATOR CIRCUIT CONFIGURED TO RESONATE AT A FUNDAMENTAL FREQUENCY AND A DIFFERENT, NON-FUNDAMENTAL FREQUENCY, A SIGNAL AT ABOUT THE NON-FUNDAMENTAL FREQUENCY — 660

DETECT, BY THE RESONATOR CIRCUIT, WHETHER THE RESONATOR IS RESONATING AT THE NON-FUNDAMENTAL FREQUENCY — 662

AMPLIFY AND BUFFER, BY AN OSCILLATOR DRIVER CIRCUIT ELECTRICALLY COUPLED TO THE RESONATOR CIRCUIT, OUTPUT OF RESONATOR CIRCUIT RESPONSIVE TO DETECTING THE RESONATOR IS RESONATING AT THE NON-FUNDAMENTAL FREQUENCY — 664

*FIG. 6*

MODE SELECT FOR MULTI-FREQUENCY OSCILLATORS

TECHNICAL FIELD

Embodiments pertain to system oscillators and an ability to achieve multiple, different, selectable frequencies from a single oscillator. Embodiments improve performance by using a high-quality oscillator driven by a lower quality oscillator that selects a frequency at which the high-quality oscillator operates.

BACKGROUND

In computing platform clocking systems, only a single reference clock is used for primary synchronization. Only a single resonator can be attached to a clock driver due to architecture limitations. However, it can be advantageous to have separate clock reference frequency and performance parameters for different system operational modes. Such modes include a low power mode and a high-performance system mode. By using a lower frequency reference with higher jitter, system power can be saved. Using a higher frequency reference with lower jitter and increased power allows high performance modes for communication systems like wireless fidelity (WiFi) and peripheral component interconnect express (PCIe). Also, current computing platforms implement multiple phase-locked loops (PLLs) or the like to support the different data rates that buses such as double data rate (DDR) memories require. The prior approach to support multiple reference frequencies is to design clock drivers separately for multiple resonators that operate at a respective frequency of the multiple reference frequencies.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

FIG. 6 illustrates, by way of example, a block diagram of an embodiment of a method for multi-mode resonator operation.

DETAILED DESCRIPTION

Figure 1:
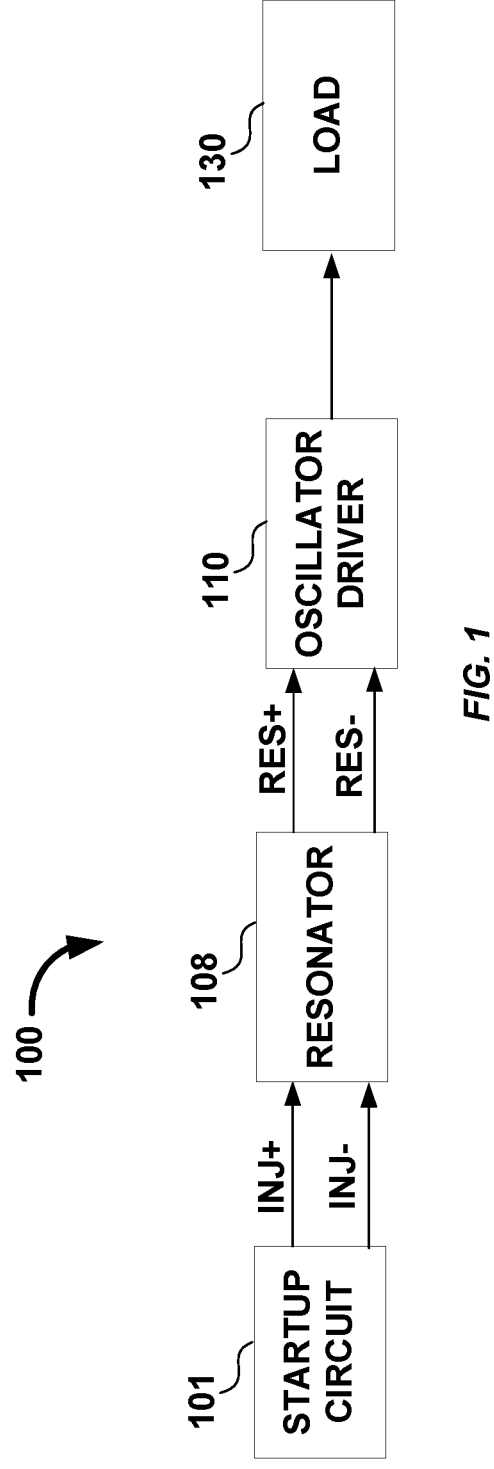
FIG. 1 illustrates, by way of example, a diagram of an embodiment of a circuit that includes a resonator with resonance frequency selected by a startup circuit.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Embodiments can allow at least some of the PLLs mentioned in the Background to be removed. Not including the PLLs provides savings in area and power. Oscillators can include feedback amplifiers. The feedback amplifiers operate by feeding energy to a resonator. The resonator is a sort of signal filter that passes a signal to its output only at its resonant frequency or frequencies. Feedback of the signal at the output causes a positive feedback loop and builds up a sinewave oscillation. The resonators typically have multiple resonance modes. The resonance modes are called a fundamental mode that corresponds to a strongest (largest quality factor "Q") output and parasitic modes in addition to the fundamental mode. The parasitic modes typically operate at a lower Q than the fundamental mode. Q is the ratio of the initial energy stored in the resonator to the energy lost in one radian of the cycle of oscillation.

As a result, startup of the oscillator into a given mode becomes a racing condition between multiple modes. There could be multiple spurious resonance modes with Q comparable to the Q of the fundamental mode. This allows the oscillator to lock into any of the resonance modes. For high frequency resonators (e.g., resonators that operate at a frequency greater than 100 Mega Hertz (MHz)) parasitic resonance of board routing is closer to a desired fundamental mode in frequency. The close frequencies make it challenging to get the oscillator to lock to a desired mode.

Embodiments provide a solution for the aforementioned problems. Embodiments provide a reliable method for channel selection in a multi-frequency resonator. Channel selection means resonant frequency selection. A multi-frequency resonator has multiple resonances or multiple physical resonators. Embodiments relax high frequency oscillator design requirements by actively starting up oscillator and avoid locking to an undesired resonance mode due to routing and or bond wires.

Current solutions for multi-frequency operation include a duplication of oscillator circuits and duplication of corresponding input/output (TO) circuitry to interface with separate off-package resonators (e.g., crystals, micro-electromechanical system (MEMS), or the like) that have fundamental frequencies at different reference frequencies. Other solutions use switches to select which of multiple resonators is driven by an oscillator. High frequency oscillators can be made robust against parasitic modes by consuming significantly more power. Embodiments do not include the extra circuitry or the higher power consumption.

The prior solutions create a barrier to the multi-reference resonator system because of consumed IO and board area for the resonator and oscillator. The additional complexity of the switches and additional routing for added oscillators also creates a challenge in routing parasitic capacitance. Further, low frequency oscillators cannot deliver low phase noise without significant amount of power (e.g., greater than 10 milliWatts (mW)). Some products implement high frequency tank elements as crystal replacements where the tank element may be integrated on a system on chip (SoC) package or may be on the system printed circuit board (PCB)

close to the package. In such a case, the routing parasitics if not followed strictly by an original equipment manufacturer (OEM)/original design manufacturer (ODM) as specified in a platform design guide will make the oscillator lock to a parasitic frequency leading to power, voltage, temperature (PVT) corners that can be avoided using a different design.

Embodiments use an active injection to 1) select a resonator among multiple resonators or a specific mode and 2) combat parasitic modes to relax routing requirements. A ring voltage-controlled oscillator (VCO) or inductor-capacitor (LC) VCO uses and impedance guided injection to search for and lock into a desired frequency. The VCO, whether a ring or LC VCO, can inject electrical energy near a desired frequency to build initial oscillation of the oscillator. After release, the oscillator takes over and amplifies oscillation to a steady state. Embodiments can leverage the injection circuit to select the desired oscillation frequency.

Embodiments make it easier to use a high frequency resonator in a circuit. In general, a high frequency resonator delivers better phase noise and jitter than a low frequency resonator when operated at a same power. Table 1 shows power, jitter, and startup time for a lower frequency resonator and a higher frequency resonator.

TABLE 1

Power, Jitter, and Startup time for low frequency
(38.4 MHz) and high frequency (307.2 MHz) resonators.

|  | Power | Integrated Jitter (12 kHz-25 MHz) | Startup Time to ±100 parts per million (ppm) |
|---|---|---|---|
| 38.4 MHz Xtal | 1 mW | 1090 fs | 292 μs |
| 307.2 MHz | 0.8 mW | 86.7 fs (11x better) | <40 μs (7x better) |

A PLL can generate a wide range of frequencies but at the expense of power consumption and jitter degradation. An example PLL can generate a 2.3 GigaHz (GHz) clock in Integer-N mode consuming about 1 mW of power and with about 715 femtoseconds (fs) Integrated Jitter from Murata 38.4 MHz Crystal. Increasing PLL power consumption to 16 mW lowers the jitter to 358 fs, which is still about 4 times higher with about 16 times higher power consumption than the high frequency oscillator in Table 1. A state-of-the-art PLL is compared to a quartz-like MEMS resonator in Table 2:

TABLE 2

Power and jitter for a state-of-the-art PLL.
Data in Table 2 from "LMK5B12204 Datasheet,"
Available at: https://www.ti.com/lit/ds/symlink/
lmk5b12204.pdf?ts=1643219139158&ref_url=
https%253A%252F%252Fwww.ti.com%252Fpro-
duct%252FLMK5B12204 and B. Razavi, "Jitter-Power Trade-Offs
in PLLs," IEEE TRANSACTIONS ON CIRCUITS AND SYSTEMS-I:
REGULAR PAPERS, vol. 68, no. 4, pp. 1381-1387, 2021.

|  | Power | Integrated Jitter (12 kHz-25 MHz) |
|---|---|---|
| TI LMK5B12204 312.5 MHz | 1010 mW | 47 fs |
| TI LMK5B12204 312.5 MHz | ~64 mW | 94 fs (Adjusted based on Theory) |
| 307.2 MHz | 0.8 mW | 86.7 fs |

As can be seen in Table 2, a PLL needs about 64 times more power to generate a same quality clock as the high frequency resonator. Embodiments relax the routing requirements for a high frequency oscillator, such as the QXMEMS oscillator, because embodiments effectively mitigate parasitic oscillation modes. In addition, for GHz clocks, a PLL can still be used, but the same performance can be achieved with lower power thanks to a higher frequency lower jitter reference resonator.

Using a lower quality VCO to inject energy to a higher quality resonator makes it possible to change the reference clock frequency of the higher quality resonator without a PLL. Removing the PLL saves a significant amount of power. The lower quality VCO can be used in switching a resonator frequency between channels.

Some new applications would be enabled by the ability to lock at different modes in the same device whether it is a crystal or a MEMS resonator such as:

(1) Self-calibration of MEMS resonators when used as thermal sensors that have the ability to switch between different resonance modes of the same physical structure and each mode has a different temperature coefficient is used to do self-calibration. In this approach switching and locking to the desired mode frequency is less than 1/10 of the thermal delay that can be important to ensure convergence of the calibration algorithm.

(2) Exploiting process variations in specifically designed resonators with spurious modes to use the frequency variation of these modes induced by process variations as a Physical Unclonable Function (PUF) of the device. The PUFs are useful in heterogeneous integrated system for customers who need to integrate a root of trust but has no trusted advanced complementary metal oxide semiconductor (CMOS) manufacturing like Department of Defense and other federal agencies.

(3) A new MEMS based VCO/digitally controlled oscillator (DCO) with granular frequency steps generated from a combination of multiple resonators and multiple modes within the same resonator.

Other applications are possible and within the scope of embodiments.

FIG. 1 illustrates, by way of example, a diagram of an embodiment of a circuit 100 that includes a resonator 108 with resonance frequency selected by a startup circuit 101. The startup circuit 101 generates a signal at a frequency that is about equal (e.g., within 1%, 2%, 3%, 4%, 5%, 10%, a greater or lesser percentage, some percentage therebetween, or the like) to a resonant frequency of the resonator 108. The startup circuit 101, by generating the frequency that is about equal to the resonant frequency of the resonator 108, forces the resonator 108 to operate at the resonant frequency. The signal generated by the startup circuit 101 can generate a signal with an order or more magnitude greater than magnitude of the undesired spurious modes (e.g., parasitic resonances or the like) of an oscillator driver circuit 110 or the circuit driven by the oscillator driver circuit 110. The startup circuit 101 can include a chirp generator or any other injection based fast start-up block (e.g., dither generator, precisely timed injection, or the like). electrically coupled with corresponding control logic. The control logic can control the frequency generated by the startup circuit 101, whether the startup circuit 101 is electrically coupled to the resonator 108, and when the resonator 108 is electrically coupled to the oscillator driver circuit 110.

The startup circuit 101 can include a chirp generator (see FIG. 2), a voltage-controlled oscillator (VCO), a ring oscillator, or the like. The chirp generator solution is robust to mitigate PVT variations. The VCO or other startup circuit solution can be used if there is accurate frequency across PVT corners and in the presence of noise.

The resonator 108 can include multiple physical resonators in parallel that operate at different resonance frequencies, a single resonator that has multiple resonance modes, or the like. The resonator 108 can include a MEMS device, a piezoelectric device, or the like.

Figure 2:
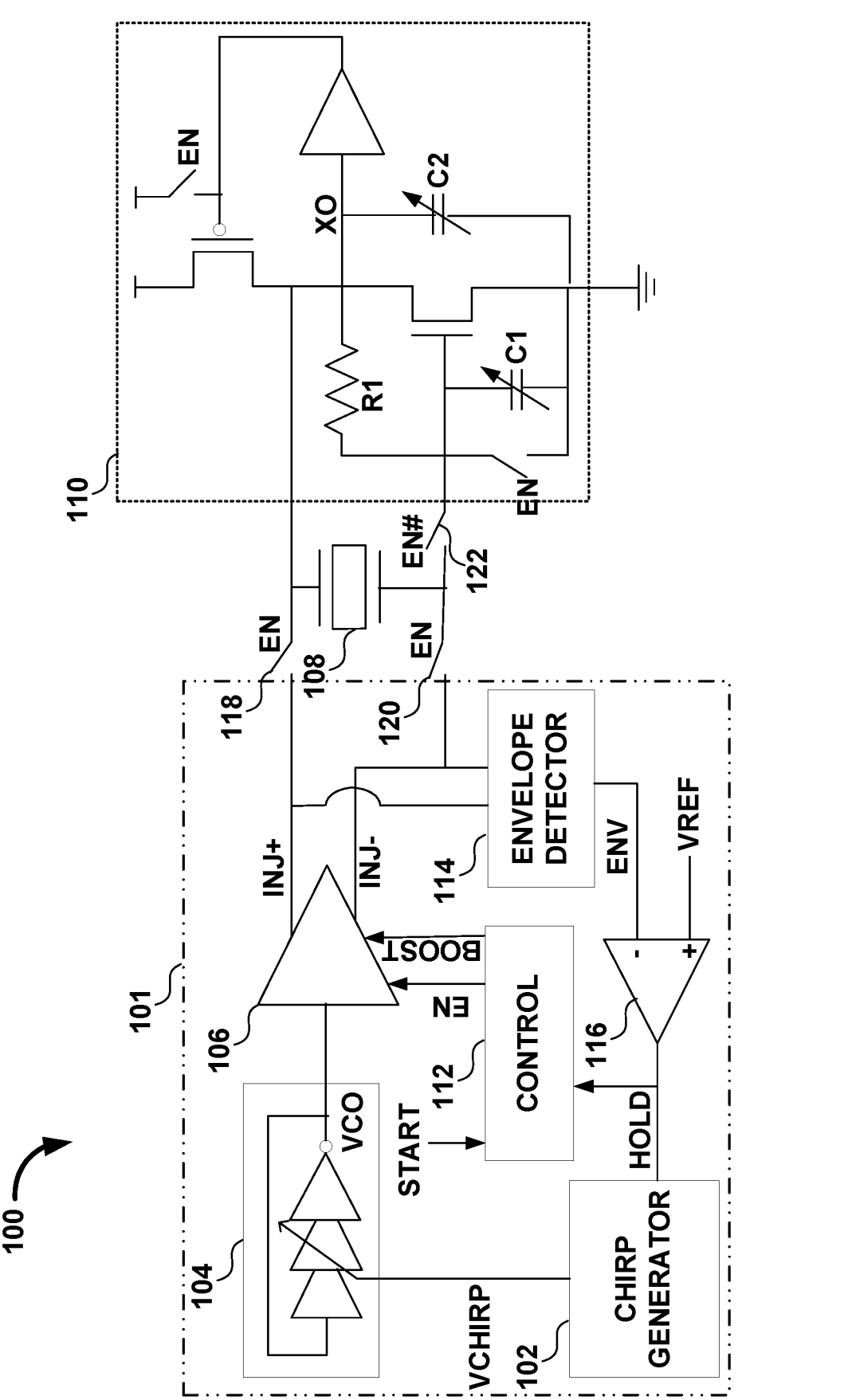
FIG. 2 illustrates, by way of example, a lower-level view diagram of an embodiment of the circuit.

The oscillator driver circuit 110 operates to amplify the output of the resonator to provide a signal at the selected resonant frequency of the resonator 108 to the load 130. The oscillator driver circuit 110 illustrated in FIG. 2 is a Pierce Oscillator Driver but can be any oscillator operable to drive signals of selected different frequencies from the resonator 108. Alternatives to the Pierce Oscillator Driver include a differential cross-coupled driver with high pass response using either a passive resistor-capacitor (RC) filter or active inductor.

The load 130 can be a compute device, a circuit on a printed circuit board (PCB) or other substrate, a system on chip (SoC), or the like. The load 130 is the device to be driven by the oscillator driver circuit 110. The load 130 can include any load that operates at one of frequencies produced by the resonator 108.

FIG. 2 illustrates, by way of example, a lower-level view diagram of an embodiment of the circuit 100. The circuit 100 as illustrated includes a chirp generator 102 that provides a chirp signal, VCHIRP, to a variable frequency oscillator 104. The variable frequency oscillator 104 generates a signal that is driven by a driver 106. The driver 106 buffers and boosts the signal from the variable frequency oscillator 104. The driver 106 drives a resonator 108 that provides a signal amplified by an oscillator driver circuit 110. Jointly the envelope detector 114, comparator 116, state machine 112, and chirp generator 102 form impedance guided feedback circuit for the driver 106 and variable frequency oscillator 104. The impedance guided feedback circuit controls the frequency of the signal from the driver 106. The impedance guided feedback circuit controls when the driver is electrically connected to and disconnected from the resonator 108.

The chirp generator 102 generates a signal that is either increasing or decreasing in frequency at a specified rate. Chirp generator circuits are known and the chirp generator can include a configuration as a known chirp generator circuit.

The variable frequency oscillator 104 is, in some embodiments, a lower Q oscillator. Example variable frequency oscillators 104 include voltage-controlled oscillators (VCOs), voltage-to-frequency converters, a ring oscillator with a selectable number of not gates, or the like. The variable frequency oscillator 104 can provide a signal to the driver 106 that changes state at a specified frequency.

The driver 106 provides a differential injection signal, INJ+ and INJ−, that drives the resonator 108 if a switch component 118, 120 is closed. The switch component 118, 120 can include a transistor or other switch device that is controlled by an enable signal (EN). The state machine 112 can control the state of EN. The switch component 118, 120 can be closed if EN is asserted and open if EN is de-asserted, or vice versa. A third switch component 122 includes opposite control as the switch component 118, 120 so as to disconnect the resonator 108 from the oscillator driver circuit 110 when the resonator 108 is electrically coupled to the driver 106.

The INJ+ and INJ− signals from the driver 106 are provided to the envelope detector 114. The INJ+ and INJ− signals indicate how close the resonator 108 is to reaching an oscillation state. The closer the resonator 108 is to resonating, the lower the impedance of the imaginary part of the resonator 108. The impedance of the imaginary part of the resonator 108 goes to zero as the frequency of the resonator 108 gets to a resonating frequency. At this frequency, the driver 106 can no longer sustain the voltage defined by the difference between INJ+ and INJ−. The drop in impedance realized by driving the resonator 108 at a resonance frequency corresponds to a drop in the envelope voltage (ENV) from the envelope detector 114.

A comparator 116 can detect when ENV drops below a reference voltage (VREF). The comparator 116 can provide a signal (HOLD) that indicates that the voltage has dropped to or below VREF, thus indicating that the resonance frequency has been reached. The HOLD signal indicates to the state machine 112 to retain the frequency output by the driver 106 for a specified amount of time. The specified amount of time is time sufficient to stabilize operation of the resonator 108. After the resonator 108 is stabilized it is much more difficult to get the resonator 108 to operate at a different resonant frequency. The parasitic resonances realized from operating the resonator 108 have much less effect on operation of the resonator 108 after it is stabilized than while it is ramping up to its stable resonating at the resonant frequency.

After the specified period of time, the state machine 112 can de-assert EN, which opens the switch components 118, 120 and closes the switch component 122. De-asserting EN effectively electrically disconnects the resonator 108 from the driver 106 and electrically connects the resonator 108 to the oscillator driver circuit 110. The oscillator driver circuit 110 then amplifies the resonator 108 signals to drive a circuit.

The state machine 112 receives HOLD and START input and changes to a different state based on the state of the HOLD and START inputs. The START input indicates when the state machine 112 is to operate to control EN and BOOST. The EN signal controls the state (whether open or closed) of switch components 118, 120, 122, switch components of the oscillator driver circuit 110, and operation of the driver 106. When EN is asserted, the driver 106 operates and when EN is de-asserted, the driver 106 does not operate. The BOOST signal controls how much the driver 106 amplifies the output of the variable frequency oscillator 104. The state machine 112 can include electric or electronic components configured to change state based on the input and perform the operations of the state machine 112 by changing state. The electric or electronic components can include one or more transistors, resistors, capacitors, diodes, inductors, switches, multiplexers, logic gates (e.g., AND, OR, XOR, negate, buffer, or the like), analog to digital converters, digital to analog converters, amplifiers, a processing unit (e.g., an application specific integrated circuit (ASIC), field programmable gate array (FPGA), central processing unit (CPU), graphics processing unit (GPU), or the like), a combination thereof, or the like.

The impedance guided feedback circuit, variable frequency oscillator, and driver 106 perform a resonator frequency search and active injection to gain fast startup of the resonator 108. The Impedance Guided Chirp Injection (IGCI) works by chirping frequency above or below the anticipated frequency of the resonator 108, monitoring the impedance of the signal from the driver 106, and when detecting the low impedance of the resonator 108 at resonating frequency, the ICGI locks and injects a generally constant frequency sinewave for a predefined amount of time. After this, the active injection is disconnected from the resonator 108 by enable switch components and the oscillator driver circuit 110 takes over and amplifies oscillation to steady state. The injected energy near the desired oscillation frequency ensures the resonator will operate with the correct frequency and suppress unwanted spurious modes.

When the resonator 108 is operated without the startup circuit 101 injection signal, it tends to lock a fundamental frequency. With the startup circuit 101 injection signal, the frequency to which the resonator 108 locks can be controlled to a non-fundamental frequency, such as a harmonic frequency or other oscillating mode of the resonator 108.

Figure 3:
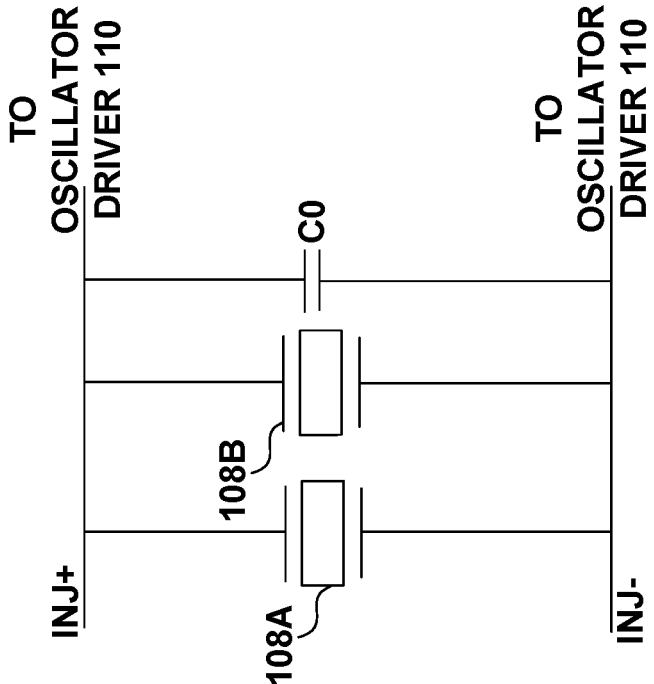
FIG. 3 illustrates, by way of example, a circuit diagram of an embodiment of multiple physical resonators.

FIG. 3 illustrates, by way of example, a circuit diagram of an embodiment of a multiple physical resonators 108A, 108B coupled in parallel between the startup circuit 101 and the oscillator driver circuit 110. The physical resonators 108A, 108B can operate at different resonant frequencies. For example, the resonator 108A can operate at a first frequency, f1, and the resonator 108B can operate at a second different frequency, f2. The startup circuit 101 can generate a signal at a frequency of about f1, for example. Then, the resonator 108A can start resonating at f1 and become nearly a short circuit (impedance can go quite low). Since f2 is different from f1, the resonator 108B will have a higher impedance and virtually no current will flow through the resonator 108B because the resonator 108A resonating at f1 is basically an open circuit.

The startup circuit 101 can generate a frequency at about f2 thus making the resonator 108B a short circuit and the resonator 108A a higher impedance path. The resonators 108A, 108B thus provide selectable, different frequencies for a circuit driven by the oscillator driver circuit 110.

Figure 4:
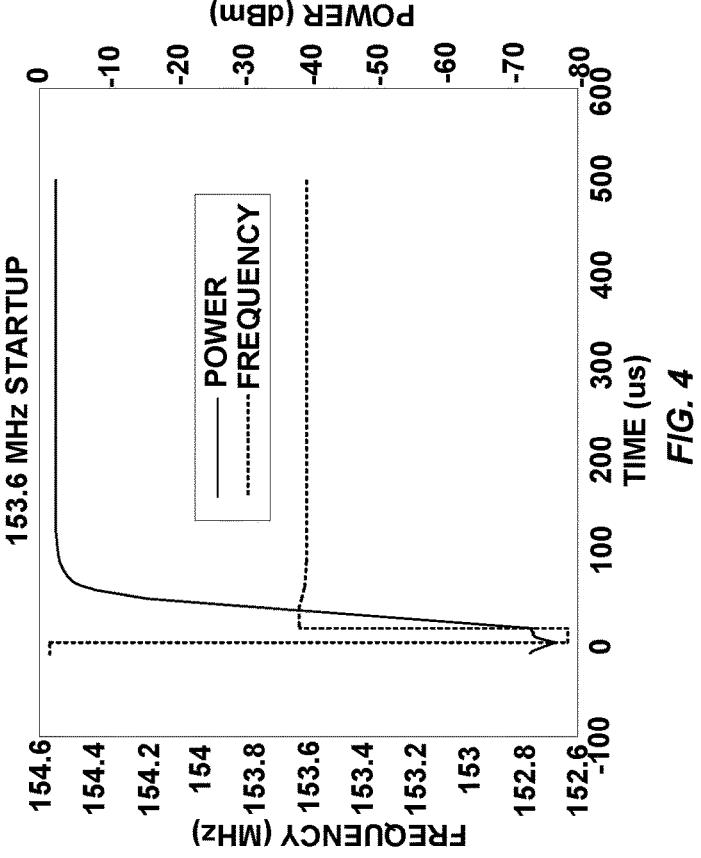
FIG. 4 illustrates, by way of example, a graph of power and frequency versus time for startup of a resonator into a fundamental frequency (e.g., 153.6 MHz in the example of FIG. 4).

FIG. 4 illustrates, by way of example, a graph of power and frequency versus time for startup of a resonator into a fundamental frequency (e.g., 153.6 MHz in the example of FIG. 4). For such a startup, an injection is not needed as the resonator reliably oscillates into its fundamental frequency. The startup circuit 101 can be operated to help ensure the resonator operates at its fundamental frequency, such as in instances in which there is known parasitic resonance at or near a non-fundamental resonance frequency of the resonator.

Figure 5:
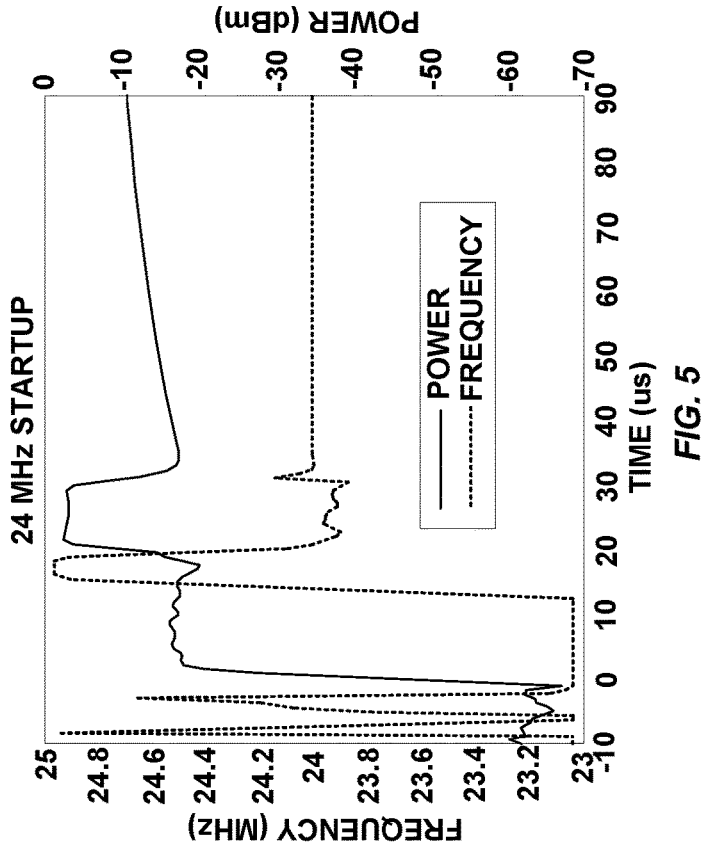
FIG. 5 illustrates, by way of example, a graph of power and frequency versus time for startup of resonator into a non-fundamental frequency (e.g., 24 MHz in the example of FIG. 5).

FIG. 5 illustrates, by way of example, a graph of power and frequency versus time for startup of resonator into a non-fundamental frequency (e.g., 24 MHz in the example of FIG. 5). An energy injection is provided to the resonator. In the example of FIG. 5, the circuit 100 is initialized at t=0 s. At about t=15 us, the startup circuit 101 is configured to chirp at about a 25 MHz frequency and sweep the frequency downward. At about t=20 us, the startup circuit 101 detects a change in impedance causing the sweep to end and enter injection phase. Although Ring VCO does not produce stable output frequency, injection between 20 us and 30 us produces enough motional current into the 24 MHz crystal such that after release (changing state of EN) at about t=30 µs, the oscillator driver circuit 110 now locks into about 24 MHz. The slower startup into the 24 MHz oscillation mode as compared to the 153.6 MHz mode is due to the lower frequency. FIGS. 4 and 5 show that using an active energy injection, the oscillator can be chosen to lock to a desired resonator among multiple resonators or despite parasitic modes.

FIG. 6 illustrates, by way of example, a block diagram of an embodiment of a method 600 for multi-frequency oscillator control. The method 600 as illustrated includes generating, by a startup circuit electrically coupled to a resonator circuit configured to resonate at a fundamental frequency and a different, non-fundamental frequency, a signal at about the non-fundamental frequency, at operation 660; detecting, by the resonator circuit, whether the resonator is resonating at the non-fundamental frequency, at operation 662; and amplifying and buffering, by an oscillator driver circuit electrically coupled to the resonator circuit, output of resonator circuit responsive to detecting the resonator is resonating at the non-fundamental frequency, at operation 664. The resonator circuit can include multiple physical resonators electrically coupled in parallel to each other or a single physical resonator that resonates at the fundamental frequency and the non-fundamental frequency.

The method 600 can further include before generating the signal at the non-fundamental frequency, closing, by the control circuit, first and second switch components, the first switch component electrically coupled between a first input of the resonator circuit and the startup circuit, second switch component electrically coupled between a second input of the resonator circuit and the startup circuit. The method 600 can further include opening, by the control circuit, the first and second switch components responsive to a specified amount of time elapsing since receiving a signal indicating an impedance of the resonator circuit has dropped below a reference voltage. The method 600 can further include opening, by the control circuit, a third switch component before generating the signal at the non-fundamental frequency, the third switch component electrically coupled between the output of the resonator and the oscillator driver circuit. The method 600 can further include closing, by the control circuit, the third switch component responsive to a specified amount of time elapsing since receiving the signal indicating the impedance of the resonator circuit has dropped below the reference voltage.

The startup circuit can further include an envelope detector and a comparator. The method 600 can further include detecting, by the envelope detector, a voltage envelope of the resonator circuit and providing, by the enveloper detector, a voltage indicating a magnitude of the voltage envelope and provide the voltage to the comparator. The method 600 can further include comparing, by the comparator, the voltage to the reference voltage and providing, by the comparator, an impedance indicator output signal indicating whether the magnitude of the voltage envelope has dropped below the reference voltage.

Figure 7:
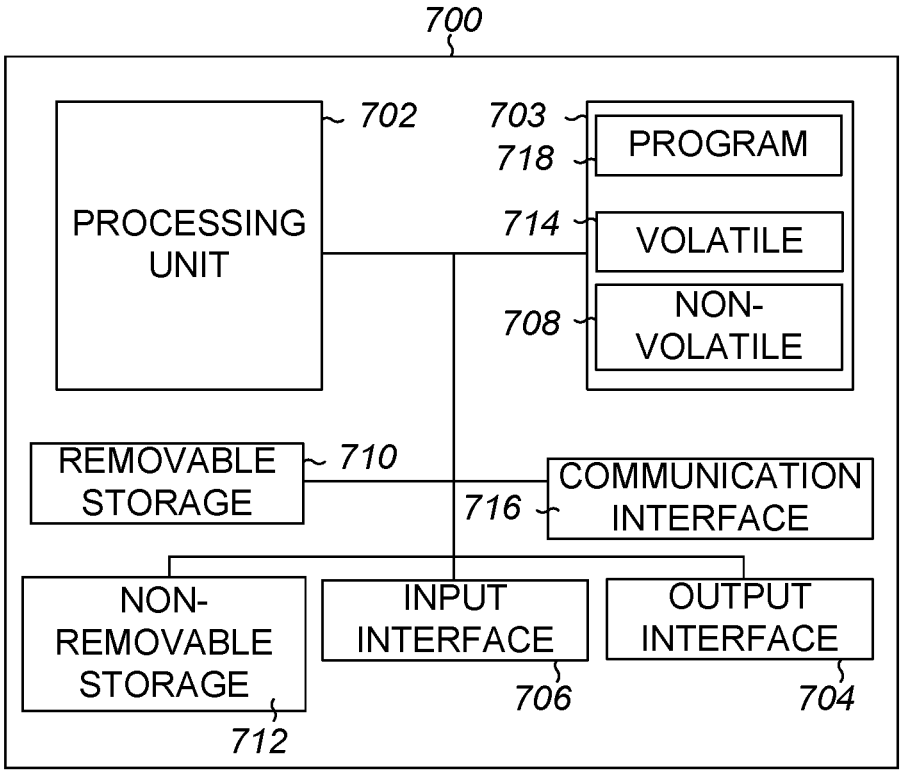
FIG. 7 illustrates, by way of example, a block diagram of an embodiment of a machine (e.g., a computer system) in which the improved resonator mode selection of FIGS. 1-5, a combination thereof or another circuit or method discussed herein can be used.

FIG. 7 illustrates, by way of example, a block diagram of an embodiment of a machine 700 (e.g., a computer system) in which the improved resonator mode selection of FIGS. 1-5, a combination thereof or another circuit or method discussed herein can be used. One example machine 700 (in the form of a computer), may include a processing unit 702, memory 703, removable storage 710, and non-removable storage 712. Although the example computing device is illustrated and described as machine 700, the computing device may be in different forms in different embodiments. Further, although the various data storage elements are illustrated as part of the machine 700, the storage may also or alternatively include cloud-based storage accessible via a network, such as the Internet.

Memory 703 may include volatile memory 714 and non-volatile memory 708. The machine 700 may include— or have access to a computing environment that includes—a variety of computer-readable media, such as volatile memory 714 and non-volatile memory 708, removable storage 710 and non-removable storage 712. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 700 may include or have access to a computing environment that includes input 706, output 704, and a communication connection 716. Output 704 may include a display device, such as a touchscreen, that also may serve as an input device. The input 706 may include one or more of a touchscreen, touchpad, mouse, keyboard, camera, one or more device-specific buttons, one or more sensors integrated within or coupled via wired or wireless data connections to the machine 700, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 702 (sometimes called processing circuitry) of the machine 700. A hard drive, CD-ROM, and RAM are some examples of articles including a non-transitory computer-readable medium such as a storage device. For example, a computer program 718 may be used to cause processing unit 702 to perform one or more methods or algorithms described herein.

Note that the term "circuitry" or "circuit" as used herein refers to, is part of, or includes hardware components, such as transistors, resistors, capacitors, diodes, inductors, amplifiers, oscillators, switches, multiplexers, logic gates (e.g., AND, OR, XOR), power supplies, memories, or the like, such as can be configured in an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" or "circuit" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry", "processing circuitry", or "processor" as used herein thus refers to, is part of, or includes circuitry capable of sequentially and automatically carrying out a sequence of arithmetic or logical operations, or recording, storing, and/or transferring digital data. These terms may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Additional Notes and Examples

Example 1 includes a circuit comprising a resonator circuit including an input and an output, the resonator circuit configured to resonate at a fundamental frequency and a different, non-fundamental frequency, a startup circuit electrically coupled to the input, the startup circuit configured to generate a signal at about the non-fundamental frequency and detect when the resonator circuit is resonating at the non-fundamental frequency, and an oscillator driver circuit electrically coupled to the output, the oscillator driver circuit configured to amplify and buffer the output of resonator circuit and drive a load.

In Example 2, Example 1 further includes, wherein the resonator circuit includes multiple physical resonators electrically coupled in parallel to each other.

In Example 3, at least one of Examples 1-2 further includes, wherein the resonator circuit includes a single physical resonator that resonates at the fundamental frequency and the non-fundamental frequency.

In Example 4, at least one of Examples 1-3 further includes, wherein the input of the resonator circuit is a first input and the resonator circuit includes a second input, the circuit further comprising a first switch component electrically coupled between the first input of the resonator circuit and the startup circuit, and a second switch component electrically coupled between the second input of the resonator circuit and the startup circuit.

In Example 5, Example 4 further includes, wherein the startup circuit includes a control circuit configured to control a state of the first and second switch components based on an impedance of the resonator.

In Example 6, Example 5 further includes, wherein the control circuit is configured to close the first and second switch components before generating the signal at the non-fundamental frequency, and open the first and second switch components responsive to a specified amount of time elapsing since receiving a signal indicating an impedance of the resonator circuit has dropped below a reference voltage.

In Example 7, at least one of Examples 5-6 further includes a third switch component electrically coupled between the output of the resonator and the oscillator driver circuit.

In Example 8, Example 7 further includes, wherein the control circuit is further configured to control a state of the third switch component based on the impedance of the resonator.

In Example 9, Example 8 further includes, wherein the control circuit is configured to open the third switch component before generating the signal at the non-fundamental frequency, and close the third switch component responsive to a specified amount of time elapsing since receiving the signal indicating the impedance of the resonator circuit has dropped below a reference voltage.

In Example 10, Example 9 further includes, wherein the control circuit is configured to close the first and second switch components and open the third switch component before generating the signal at the non-fundamental frequency.

In Example 11, at least one of Examples 1-10 further includes, wherein the startup circuit includes a variable frequency resonator and a chirp generator controlled by the control circuit, wherein the control circuit is further configured to cause the chirp generator to sweep a signal in frequency.

In Example 12, Example 11 further includes, wherein the startup circuit further includes an envelope detector and a comparator, the envelope detector configured to detect a voltage envelope of the resonator circuit and provide a voltage indicating a magnitude of the voltage envelope and provide the voltage to the comparator, the comparator configured to compare the voltage to a reference voltage and provide an impedance indicator output indicating whether the magnitude of the voltage envelope has dropped below the reference voltage.

Example 13 includes a system comprising a resonator circuit including an input and an output, the resonator circuit configured to resonate at a fundamental frequency and a different, non-fundamental frequency, a startup circuit electrically coupled to the input, the startup circuit configured to generate a signal at about the non-fundamental frequency and detect when the resonator circuit is resonating at the non-fundamental frequency, an oscillator driver circuit electrically coupled to the output, the oscillator driver circuit configured to amplify and buffer the output of resonator circuit, and a load coupled to the oscillator driver circuit, the load including electric components that operate at the fundamental frequency and at the non-fundamental frequency.

In Example 14, Example 13 further includes, wherein the resonator circuit includes multiple physical resonators electrically coupled in parallel to each other or a single physical resonator that resonates at the fundamental frequency and the non-fundamental frequency.

In Example 15, Example 14 further includes, wherein the input of the resonator circuit is a first input and the resonator circuit includes a second input, the circuit further comprising a first switch component electrically coupled between the first input of the resonator circuit and the startup circuit, a second switch component electrically coupled between the second input of the resonator circuit and the startup circuit, and a third switch component electrically coupled between the output of the resonator and the oscillator driver circuit.

In Example 16, Example 15 further includes, wherein the startup circuit includes a control circuit configured to close the first and second switch components before generating the signal at the non-fundamental frequency, open the first and second switch components responsive to a specified amount of time elapsing since receiving a signal indicating an impedance of the resonator circuit has dropped below a reference voltage, open the third switch component before generating the signal at the non-fundamental frequency, and close the third switch component responsive to a specified amount of time elapsing since receiving the signal indicating the impedance of the resonator circuit has dropped below the reference voltage.

Example 17 includes a method of multi-frequency oscillator control, the method comprising generating, by a startup circuit electrically coupled to a resonator circuit configured to resonate at a fundamental frequency and a different, non-fundamental frequency, a signal at about the non-fundamental frequency, detecting, by the resonator circuit, whether the resonator is resonating at the non-fundamental frequency, and amplifying and buffering, by an oscillator driver circuit electrically coupled to the resonator circuit, output of resonator circuit responsive to detecting the resonator is resonating at the non-fundamental frequency.

In Example 18, Example 17 further includes, wherein the resonator circuit includes multiple physical resonators electrically coupled in parallel to each other or a single physical resonator that resonates at the fundamental frequency and the non-fundamental frequency.

In Example 19, Example 18 further includes before generating the signal at the non-fundamental frequency, closing, by the control circuit, first and second switch components, the first switch component electrically coupled between a first input of the resonator circuit and the startup circuit, second switch component electrically coupled between a second input of the resonator circuit and the startup circuit, opening, by the control circuit, the first and second switch components responsive to a specified amount of time elapsing since receiving a signal indicating an impedance of the resonator circuit has dropped below a reference voltage, opening, by the control circuit, a third switch component before generating the signal at the non-fundamental frequency, the third switch component electrically coupled between the output of the resonator and the oscillator driver circuit, and closing, by the control circuit, the third switch component responsive to a specified amount of time elapsing since receiving the signal indicating the impedance of the resonator circuit has dropped below the reference voltage.

In Example 20, Example 19 further includes, wherein the startup circuit further includes an envelope detector and a comparator, the method comprising detecting, by the envelope detector, a voltage envelope of the resonator circuit and providing, by the enveloper detector, a voltage indicating a magnitude of the voltage envelope and provide the voltage to the comparator, and comparing, by the comparator, the voltage to the reference voltage and providing, by the comparator, an impedance indicator output signal indicating whether the magnitude of the voltage envelope has dropped below the reference voltage.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A circuit comprising:
a resonator circuit including an input and an output, the resonator circuit configured to resonate at a fundamental frequency and a different, non-fundamental frequency;
a startup circuit electrically coupled to the input, the startup circuit configured to generate a signal at about the non-fundamental frequency and detect when the resonator circuit is resonating at the non-fundamental frequency; and
an oscillator driver circuit electrically coupled to the output, the oscillator driver circuit configured to amplify and buffer the output of resonator circuit and drive a load, wherein the resonator circuit includes multiple physical resonators electrically coupled in parallel to each other.

2. The circuit of claim 1, wherein the resonator circuit includes a single physical resonator that resonates at the fundamental frequency and the non-fundamental frequency.

3. The circuit of claim 1, wherein the input of the resonator circuit is a first input and the resonator circuit includes a second input, the circuit further comprising:
a first switch component electrically coupled between the first input of the resonator circuit and the startup circuit; and
a second switch component electrically coupled between the second input of the resonator circuit and the startup circuit.

4. The circuit of claim 3, wherein the startup circuit includes a control circuit configured to control a state of the first and second switch components based on an impedance of the resonator.

5. The circuit of claim 4, wherein the control circuit is configured to:
close the first and second switch components before generating the signal at the non-fundamental frequency; and
open the first and second switch components responsive to a specified amount of time elapsing since receiving a signal indicating an impedance of the resonator circuit has dropped below a reference voltage.

6. The circuit of claim 4, further comprising:
a third switch component electrically coupled between the output of the resonator and the oscillator driver circuit.

7. The circuit of claim 6, wherein the control circuit is further configured to control a state of the third switch component based on the impedance of the resonator.

8. The circuit of claim 7, wherein the control circuit is configured to:
open the third switch component before generating the signal at the non-fundamental frequency; and
close the third switch component responsive to a specified amount of time elapsing since receiving the signal indicating the impedance of the resonator circuit has dropped below a reference voltage.

9. The circuit of claim 8, wherein the control circuit is configured to close the first and second switch components and open the third switch component before generating the signal at the non-fundamental frequency.

10. The circuit of claim 1, wherein the startup circuit includes a variable frequency resonator and a chirp generator controlled by the control circuit, wherein the control circuit is further configured to cause the chirp generator to sweep a signal in frequency.

11. The circuit of claim 10, wherein the startup circuit further includes an envelope detector and a comparator, the envelope detector configured to detect a voltage envelope of the resonator circuit and provide a voltage indicating a magnitude of the voltage envelope and provide the voltage to the comparator, the comparator configured to compare the voltage to a reference voltage and provide an impedance indicator output indicating whether the magnitude of the voltage envelope has dropped below the reference voltage.

12. A system comprising:
a resonator circuit including an input and an output, the resonator circuit configured to resonate at a fundamental frequency and a different, non-fundamental frequency;
a startup circuit electrically coupled to the input, the startup circuit configured to generate a signal at about the non-fundamental frequency and detect when the resonator circuit is resonating at the non-fundamental frequency;
an oscillator driver circuit electrically coupled to the output, the oscillator driver circuit configured to amplify and buffer the output of resonator circuit; and
a load coupled to the oscillator driver circuit, the load including electric components that operate at the fundamental frequency and at the non-fundamental frequency, wherein the resonator circuit includes at least one of multiple physical resonators electrically coupled in parallel to each other or a single physical resonator that resonates at the fundamental frequency and the non-fundamental frequency.

13. The system of claim 12, wherein the input of the resonator circuit is a first input and the resonator circuit includes a second input, the circuit further comprising: a first switch component electrically coupled between the first input of the resonator circuit and the startup circuit; a second switch component electrically coupled between the second input of the resonator circuit and the startup circuit; and a third switch component electrically coupled between the output of the resonator and the oscillator driver circuit.

14. The system of claim 13, wherein the startup circuit includes a control circuit configured to:

close the first and second switch components before generating the signal at the non-fundamental frequency;

open the first and second switch components responsive to a specified amount of time elapsing since receiving a signal indicating an impedance of the resonator circuit has dropped below a reference voltage;

open the third switch component before generating the signal at the non-fundamental frequency; and close the third switch component responsive to a specified amount of time elapsing since receiving the signal indicating the impedance of the resonator circuit has dropped below the reference voltage.

15. A method of multi-frequency oscillator control, the method comprising:

generating, by a startup circuit electrically coupled to a resonator circuit configured to resonate at a fundamental frequency and a different, non-fundamental frequency, a signal at about the non-fundamental frequency;

detecting, by the resonator circuit, whether the resonator is resonating at the non-fundamental frequency; and amplifying and buffering, by an oscillator driver circuit electrically coupled to the resonator circuit, output of resonator circuit responsive to detecting the resonator is resonating at the non-fundamental frequency, wherein the resonator circuit includes at least one of multiple physical resonators electrically coupled in parallel to each other or a single physical resonator that resonates at the fundamental frequency and the non-fundamental frequency.

16. The method of claim 15, further comprising: before generating the signal at the non-fundamental frequency, closing, by the control circuit, first and second switch components, the first switch component electrically coupled between a first input of the resonator circuit and the startup circuit, second switch component electrically coupled between a second input of the resonator circuit and the startup circuit; opening, by the control circuit, the first and second switch components responsive to a specified amount of time elapsing since receiving a signal indicating an impedance of the resonator circuit has dropped below a reference voltage; opening, by the control circuit, a third switch component before generating the signal at the non-fundamental frequency, the third switch component electrically coupled between the output of the resonator and the oscillator driver circuit; and closing, by the control circuit, the third switch component responsive to a specified amount of time elapsing since receiving the signal indicating the impedance of the resonator circuit has dropped below the reference voltage.

17. The method of claim 16, wherein the startup circuit further includes an envelope detector and a comparator, the method comprising:

detecting, by the envelope detector, a voltage envelope of the resonator circuit and providing, by the enveloper detector, a voltage indicating a magnitude of the voltage envelope and provide the voltage to the comparator; and comparing, by the comparator, the voltage to the reference voltage and providing, by the comparator, an impedance indicator output signal indicating whether the magnitude of the voltage envelope has dropped below the reference voltage.

* * * * *